(12) United States Patent
Yu et al.

(10) Patent No.: US 11,804,541 B2
(45) Date of Patent: Oct. 31, 2023

(54) BIPOLAR TRANSISTOR STRUCTURE WITH EMITTER/COLLECTOR CONTACT TO DOPED SEMICONDUCTOR WELL AND RELATED METHODS

(71) Applicant: GlobalFoundries U.S. Inc., Malta, NY (US)

(72) Inventors: Hong Yu, Clifton Park, NY (US); Vibhor Jain, Clifton Park, NY (US)

(73) Assignee: GlobalFoundries U.S. Inc., Malta, NY (US)

(*) Notice: Subject to any disclaimer, the term of this patent is extended or adjusted under 35 U.S.C. 154(b) by 52 days.

(21) Appl. No.: 17/578,011

(22) Filed: Jan. 18, 2022

(65) Prior Publication Data

US 2023/0231040 A1 Jul. 20, 2023

(51) Int. Cl.
*H01L 29/735* (2006.01)
*H01L 29/08* (2006.01)
(Continued)

(52) U.S. Cl.
CPC ........ *H01L 29/735* (2013.01); *H01L 29/0808* (2013.01); *H01L 29/0821* (2013.01); *H01L 29/41708* (2013.01); *H01L 29/6625* (2013.01)

(58) Field of Classification Search
CPC .............. H01L 29/735; H01L 29/0808; H01L 29/0821; H01L 29/41708; H01L 29/41716; H01L 29/4933; H01L 29/7398; H01L 29/6625; H01L 29/665–66507; H01L 21/74–746; H01L 21/823443; H01L 21/823835; H01L 29/732; H01L 29/063; H01L 29/6656; H01L 29/0649; H01L 29/0847; H01L 29/0673; H01L 29/775; H01L 29/66439; H01L 29/78696;
(Continued)

(56) References Cited

U.S. PATENT DOCUMENTS 6,949,764 B2    9/2005 Ning
8,288,758 B2   10/2012 Ning et al.
(Continued)

FOREIGN PATENT DOCUMENTS

WO    WO-03043080 A1 *  5/2003   ......... H01L 21/8249

OTHER PUBLICATIONS

Vibhor Jain et al., "Study of mutual and self-thermal resistance in 90nm SiGe HBTs," IEEE BCTM 1.4, 2013, 17-20.
(Continued)

*Primary Examiner* — Natalia A Gondarenko
(74) *Attorney, Agent, or Firm* — Francois Pagette; Hoffman Warnick LLC

(57) ABSTRACT

Embodiments of the disclosure provide a lateral bipolar transistor structure with an emitter/collector (E/C) contact to a doped semiconductor well and related methods. A bipolar transistor structure according to the disclosure may include a doped semiconductor well over a semiconductor substrate. An insulative region is on the doped semiconductor well. A base layer is on the insulative region, and an emitter/collector (E/C) layer on the insulative region and adjacent a first sidewall of the base layer. An E/C contact to the doped semiconductor well includes a lower portion adjacent the insulative region and an upper portion adjacent and electrically coupled to the E/C layer.

20 Claims, 7 Drawing Sheets

(51) Int. Cl.
*H01L 29/66* (2006.01)
*H01L 29/417* (2006.01)

(58) Field of Classification Search
CPC ........... H01L 29/42392; H01L 27/0623; H01L 27/0823; H01L 21/76897; H01L 21/823493; H01L 21/823475; H01L 21/823468; H01L 21/82285; H01L 21/823821; H01L 29/04; H01L 29/0804–0834; H01L 29/1004; H01L 29/1008; H01L 29/0696; H01L 29/42304; H01L 29/66234–66348; H01L 29/66265; H01L 29/66295–66303; H01L 29/66325; H01L 29/66333–66348; H01L 29/66287; H01L 29/66242; H01L 29/73–7378; H01L 29/737; H01L 29/739–7398; H01L 29/7325; H01L 29/0817; H01L 29/7375; H01L 29/7393–7395; H01L 29/7397; H01L 27/0229–0244; H01L 27/0262; H01L 27/0263; H01L 27/082–0828; H01L 27/102; H01L 27/1022; H01L 27/11801; H01L 27/11896; H01L 27/2445
USPC ....... 257/565, 401, 117, 129, 526, 557, 575, 257/576, 558, 581; 438/204, 236, 335
See application file for complete search history.

(56) References Cited

U.S. PATENT DOCUMENTS

| | | | |
|---|---|---|---|
| 8,420,493 B2 | 4/2013 | Ning et al. | |
| 8,586,441 B1* | 11/2013 | Cai | H01L 29/161 |
| | | | 257/E21.372 |
| 9,171,924 B2* | 10/2015 | Cai | H01L 27/1203 |
| 9,530,711 B2 | 12/2016 | Botula et al. | |
| 9,536,788 B1 | 1/2017 | Ning et al. | |
| 10,825,921 B2 | 11/2020 | Balakrishnan et al. | |
| 2007/0001262 A1* | 1/2007 | Ouyang | H01L 27/1203 |
| | | | 257/565 |
| 2014/0332903 A1* | 11/2014 | Cheng | H01L 27/0883 |
| | | | 257/401 |
| 2023/0065924 A1 | 3/2023 | Derrickson et al. | |
| 2023/0075062 A1 | 3/2023 | Yu et al. | |

OTHER PUBLICATIONS

Jefy A. Jayamon et al., "Multigate-Cell Stacked FET Design for Millimeter-Wave CMOS Power Amplifiers," IEEE Journal of Solid-State Circuits, vol. 51, No. 9, Sep. 2016, 2027-2039.

Jay P. John et al., Optimization of a SiGe:C HBT in a BiCMOS Technology for Low Power Wireless Applications, IEEE BCTM 11.2, 2002, 193-196.

Todd Thiebeault et al., "A Study of Ultra-High Performance SiGe HBT Devices on SOI," IEEE BCTM 13.4, downloaded on Dec. 15, 2021, 236-238.

* cited by examiner

BIPOLAR TRANSISTOR STRUCTURE WITH EMITTER/COLLECTOR CONTACT TO DOPED SEMICONDUCTOR WELL AND RELATED METHODS

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs, and/or operational parameters that do not meet certain requirements. Various alternative configurations for bipolar transistors, particularly lateral bipolar transistors, may provide sufficient electrical performance for various operations but at the expense of other physical properties. In some devices or operational settings, certain bipolar transistor structures may impose a risk of exhibiting elevated operating temperatures.

SUMMARY

The illustrative aspects of the present disclosure are designed to solve the problems herein described and/or other problems not discussed.

Embodiments of the disclosure provide a bipolar transistor structure including: a doped semiconductor well over a semiconductor substrate; an insulative region on the doped semiconductor well; a base layer on the insulative region; an emitter/collector (E/C) layer on the insulative region and adjacent a first sidewall of the base layer; and an E/C contact to the doped semiconductor well, the E/C contact including a lower portion adjacent the insulative region and an upper portion adjacent and electrically coupled to the E/C layer.

Other embodiments of the disclosure provide a bipolar transistor structure including: a doped semiconductor well over a semiconductor substrate; a insulative region on the doped semiconductor well; a base layer on the insulative region; a first emitter/collector (E/C) layer on the insulative region and adjacent a first sidewall of the base layer; a first E/C contact to the doped semiconductor well, the first E/C contact including a lower portion adjacent the insulative region and an upper portion adjacent and electrically coupled to the first E/C layer; a second E/C layer on the insulative region and adjacent a second sidewall of the base layer opposite the first sidewall; and a second E/C contact to the second E/C layer, wherein a lower surface of the second E/C contact is on an upper surface of the second E/C layer, and above the insulative region.

Additional embodiments of the disclosure provide a method of forming a bipolar transistor structure, the method including: forming a doped semiconductor well over a semiconductor substrate; forming a base layer on an insulative layer over the doped semiconductor well; forming an emitter/collector (E/C) layer on a insulative region and adjacent a first sidewall of the base layer; and forming an E/C contact to the doped semiconductor well, the E/C contact including a lower portion adjacent the insulative region and an upper portion adjacent and electrically coupled to the E/C layer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
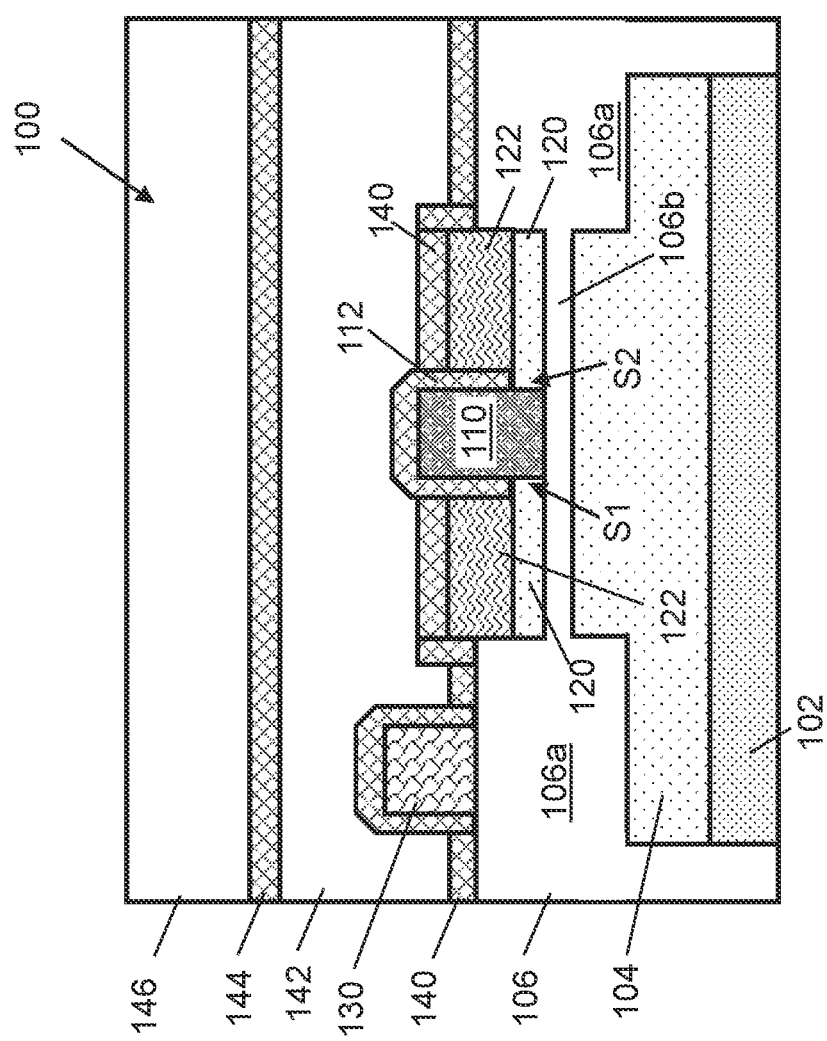
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor structure in which an emitter/collector contact to the emitter or collector terminal of the transistor extends (e.g., through a buried insulator layer) to a doped semiconductor well that is located below the bipolar transistor structure. The doped semiconductor well may be over a semiconductor substrate and may have an insulative region thereover. A base layer may be on the insulative region, e.g., such that the insulative region vertically separates the doped semiconductor well from the base layer. An E/C layer formed of doped semiconductor material also may be on the insulative region, and adjacent a sidewall of the base layer. The bipolar transistor structure includes an E/C contact to the doped semiconductor well, i.e., it may have a lower surface or sidewall that is in thermal communication with the doped semiconductor well. A lower portion of the E/C contact is adjacent the insulative region, and an upper portion of the E/C contact is adjacent and electrically coupled to the E/C layer.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, a preliminary structure 100 (simply "structure" hereafter) suitable to form a lateral bipolar transistor structure according to embodiments of the disclosure, is shown. Preliminary structure 100 may be processed as described herein to yield one or more lateral bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. A doped semiconductor well 104 may be included on or within substrate 102, e.g., to enable electrical biasing of structures or components formed above substrate 102. Doped semiconductor well 104 may have the same dopant type as substrate 102 (e.g., P type doping), but may have a higher dopant concentration therein.

Preliminary structure 100 includes embedded elements for electrically separating active materials formed thereon from other regions and/or materials on substrate 102. An insulative region 106 may be formed over substrate 102, e.g., by forming one or more insulative materials on doped semiconductor well by deposition and/or by otherwise converting pre-existing semiconductor material into an insulative substance. Insulative region 106 may extend horizontally over substrate 102 and doped semiconductor well 104, and/or may be located under locations where active materials are formed, examples of which are discussed elsewhere herein. Insulative region 106 may include oxygen doping to form a dielectric insulator or a buried oxide ("BOX") layer above substrate 102 and electrically isolate overlying active semiconductor materials. Insulative region 106 may include other elements or molecules such as Ge, N, or Si.

Insulative region 106 may include, e.g., a trench isolation region 106a and a buried insulator layer 106b that is adjacent trench isolation region 106a. Trench isolation region 106a may be included within an intermediate region that is horizontally between distinct electrically active components and may have a relatively larger vertical thickness (e.g., at least approximately six-hundred nanometers (nm)) as compared to other parts of insulative region 106. Trench isolation region 106a may be embodied as, or may include portions of, a trench isolation (TI) region for horizontally separating distinct regions of active material. Buried insulator layer 106b of insulative region 106 may be sized as narrow as possible to provide better interaction with overlying semiconductor materials, and in various embodiments may have a thickness that is at most approximately five nm to approximately five-hundred nm. In some cases, multiple insulative regions 106 may be formed over substrate 102 and/or regions of different vertical thickness may be formed. Each portion 106a, 106b of insulative region 106 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Preliminary structure 100 may include a base layer 110 on buried insulator layer 106b of insulative region 106. Base layer 110 may include, e.g., SiGe or any other semiconductor material that is doped to have a predetermined polarity. In the case where doped semiconductor well 104 is doped n-type, base layer 110 may be doped p-type to form a P-N junction adjacent emitter/collector materials discussed herein. In further examples, base layer 110 may be a stack of layers of alternating composition (e.g., alternating Si and SiGe layers), in which case the uppermost layer of the stack is highly doped to form an extrinsic base region. It is also understood that base layer 110 may be doped n-type in alternative embodiments. However embodied, base layer 110 may extend to a predetermined height over insulative region 106, and as discussed herein base layer 110 may be significantly taller than adjacent emitter or collector materials to be used within a bipolar structure. One or more spacers 112 may be adjacent base layer 110 to structurally and electrically separate base layer from adjacent electrically active materials (e.g., emitter and collector layers and/or contacts formed thereto. Spacer(s) 112 may include a nitride insulative material and/or any other insulative material discussed herein, e.g., regarding buried insulative layer 106 or other insulating structures. Spacer(s) 112 be formed, e.g., by depositing a corresponding spacer material such that it covers any exposed surfaces and sidewalls S1, S2 of base layer 110 before other materials are formed over substrate 102 and adjacent base layer 110. In some implementations, spacer(s) 112 may include a single layer or more than two layers.

Preliminary structure 100 also may include a set of emitter/collector (E/C) layers 120 on buried insulator layer 106b. One E/C layer 120 may be adjacent a first sidewall S1 of base layer 110, while another E/C layer 120 may be adjacent a second sidewall S2 of base layer 110. E/C layer(s) 120 may define all or part of the active bipolar transistor materials for emitter and collector terminals of a bipolar transistor structure. E/C layers 120 may be formed on respective portions of insulative region 106, e.g., by deposition and doping doped semiconductor material. E/C layers 120 may include the same material composition as base layer 110 (e.g., doped SiGe), but with an opposite doping type (e.g., they may be doped n-type when first base layer 110 is doped p-type or vice versa). E/C layers 120 additionally or alternatively may include other electrically active semiconductor materials. E/C layers 120 may be formed to a desired thickness above buried insulator layer 106b. E/C layers 120, however, may have a height above buried insulator layer 106b that is less than the height of base layer 110 over buried insulator layer 106b.

Preliminary structure 100 may include a set of raised emitter/collector (E/C) layers 122 on E/C layers 120. Raised E/C layers 122 may be formed by deposition and/or epitaxial growth of silicon and/or other semiconductor materials on E/C layers 120 and may be of the same doping type as E/C layers 120. Raised E/C layers 122 can be formed for example by selectively growing silicon material on upper surfaces of E/C layers 120. Raised E/C layers 122, however, may have a higher concentration of dopants than E/C layers 120 thereunder. The higher doping concentration in raised E/C layers 122 may increase electrical conductivity between raised E/C layers 122 and any overlying contacts for transmitting current to the lateral bipolar transistor structure, and/or may facilitate silicide formation in subsequent processing. Due to being formed on E/C layers 120, raised E/C layers 122 may be horizontally adjacent spacer(s) 112 to physically and electrically isolate raised E/C layers 122 from base layer 110.

Preliminary structure 100 also may include, e.g., a gate structure 130 on trench isolation region 106a of insulative region 106. In this configuration, gate structure 130 may be horizontally distal to any materials over buried insulator layer 106b of insulative region 106. That is, gate structure 130 may be spaced horizontally away from base layer 110, E/C layer(s) 120, raised E/C layer(s) 122, etc., by a predetermined horizontal separation distance. Gate structure 130 may include any type of semiconductor material (e.g., such as those suitable for substrate 102) and/or other types of materials capable of being deposited on insulative region 106 at selected locations. However, gate structure 130 may be electrically inactive and thus may be free of p-type or n-type dopants. Gate structure 130 may be formed through an independent process to form various gate structures for field effect transistors and/or other electrically active components but may not be converted into an electrically active component in subsequent processing. For instance, gate structure 130 may remain electrically inactive by not being targeted for metal gate replacement. However, as discussed elsewhere herein, conductive contacts to E/C layer(s) 120 may be formed partially on gate structure 130 in subsequent processing, and gate structure 130 may act as a marking structure to help form conductive materials, where desired.

An insulative film 140 of preliminary structure 100 may be formed on exposed upper surfaces of insulative region 106, base layer 110, raised E/C layer(s) 122, and gate structure 130. Insulative film 140 can be provided as one or more bodies of insulating material formed on sidewalls of exposed material(s), e.g., by deposition, thermal growth, etc., to electrically and physically insulate materials subsequently formed on the coated material(s) from other components. Portions of insulative film 140 in some cases may form or define spacers 112, but insulative film 140 may cover spacers 112 in other implementations. Insulative film 140 may be formed, e.g., by depositing the corresponding spacer material such that it covers any exposed surfaces and sidewalls of underlying materials in preliminary structure 100. In some implementations, insulative film(s) 140 may include a single layer or more than two layers.

An inter-level dielectric (ILD) layer 142 may be above insulative film 140, and may be formed by deposition or other techniques of forming an insulative material on a structure. ILD layer 142 may include the same insulating material as insulative region 106 or may include a different electrically insulative material. After depositing ILD layer 142, ILD layer 142 can be planarized (e.g., using CMP) such that its upper surface is substantially coplanar and above all underlying components of preliminary structure 100. Preliminary structure 100 may include an insulative film 144 on ILD layer 142, e.g., an additional layer of nitride and/or other insulative materials distinct from ILD layer 142. Insulative film 144 may structurally and electrically separate preliminary structure into distinct levels, e.g., to allow overlying metal wires and vias to be formed over insulative film 144 and ILD layer 142 in subsequent processing. Where insulative film 144 is included, an additional ILD layer 146 (including, e.g., the same material(s) as ILD layer 142) may be formed over insulative film 144.

Figure 2:
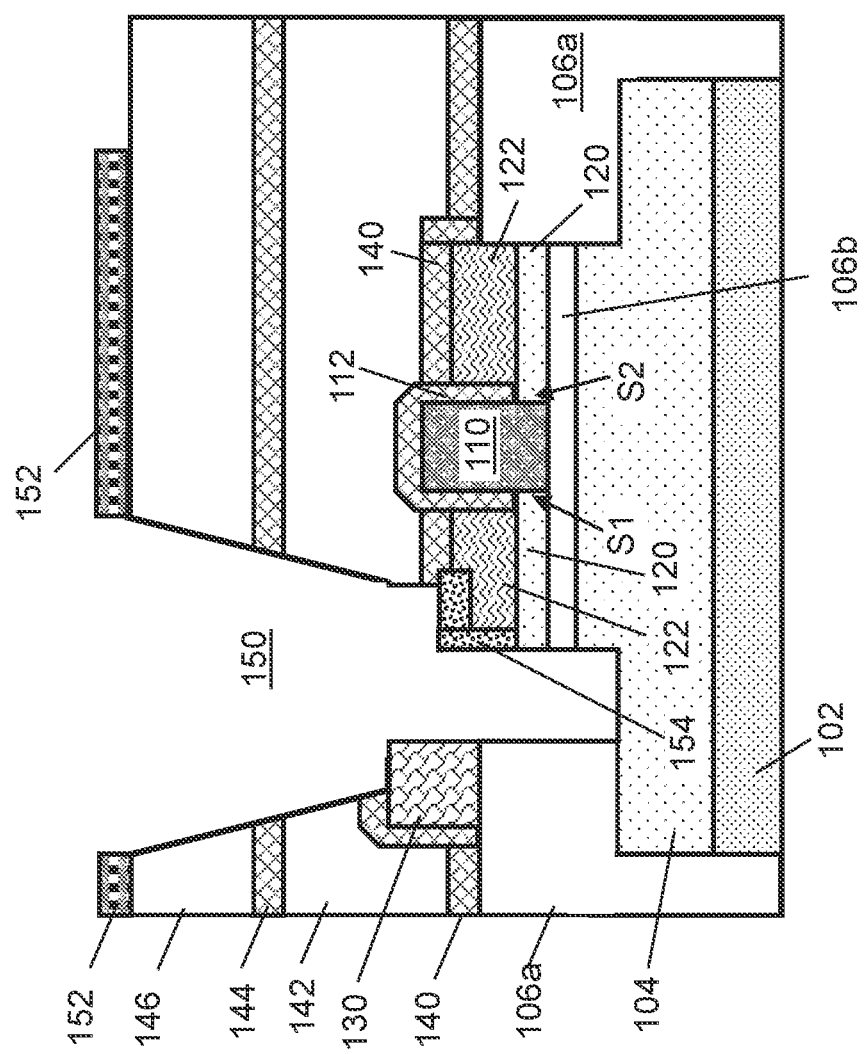
FIG. 2 provides a cross-sectional view of forming a first contact opening according to embodiments of the disclosure.

Turning to FIG. 2, methods according to the disclosure may include forming a first opening 150 through ILD layers 142, 146, insulative film 144, insulative film 140, and further through insulative region 106 to expose doped semiconductor well 104. First opening 150 may be formed using a mask 152 at a targeted position to expose additional ILD layer 146 and any material(s) thereunder. Mask 152 may include any now known or later developed appropriate masking material, e.g., a nitride hard mask. As shown in FIG. 2, any appropriate etching process, e.g., reactive ion etching (RIE), removes layers 106, 140, 142, 144, 146 to expose doped semiconductor well 104. The structure of mask 152 may cause an upper surface and/or sidewall(s) of doped semiconductor layer 104 to be exposed within first opening 150. First opening 150 also exposes adjacent portions of E/C layer 120 and raised E/C layer 122 thereover. First opening 150 additionally may expose an upper portion and sidewalls of gate structure 130 therein. In some cases, gate structure 130 may be formed of detectable materials relative to ILD layer 142, e.g., for alignment and positioning of mask 152. The forming of first opening 150 thus can be carried out at any location where conductive material can be formed for coupling to layer(s) 120, 122.

FIG. 2 also depicts forming a first silicide layer 154 on E/C layer(s) 120 and raised E/C layer(s) 122 within first opening 150. First silicide layer 154 may be formed to enhance the electrical conductivity between raised E/C layer 122 and conductors formed thereon. First silicide layer 154 may be formed by forming a conductive metal (e.g., cobalt, titanium, nickel, platinum, or other materials) on raised E/C layer 122, annealing the metal to yield conductive silicide material(s) (e.g., cobalt silicide, titanium silicide, etc.) on exposed surfaces of raised E/C layer 122, and removing excess conductive metal. The initially formed metal may be selectively coated on raised E/C layer 122, e.g., to prevent first silicide layer 154 from forming on doped semiconductor well 104 or on E/C layer 120 within opening 150. First E/C layer 122 may be formed to allow for stronger electrical coupling to overlying contacts. It is understood that silicide layer 154 alternatively may be formed in an earlier processing phase. For instance, first silicide layer 154 may be formed within preliminary structure 100 (FIG. 1) before first opening 150 is created., e.g., during the forming of preliminary structure 100.

Figure 3:
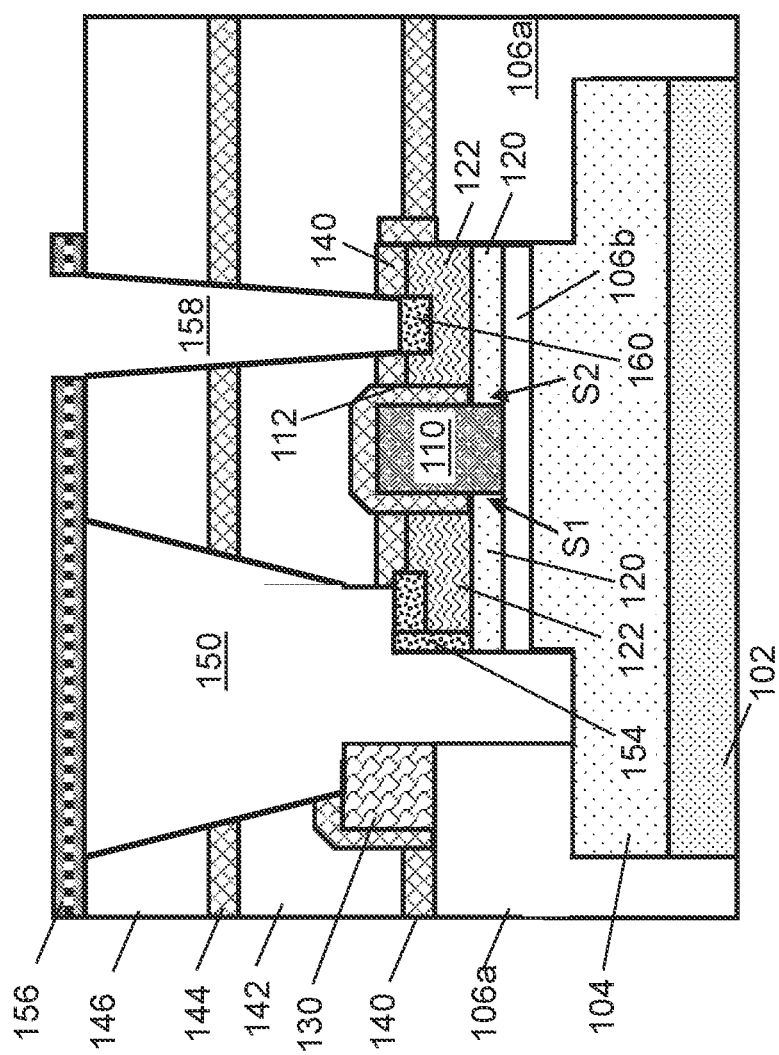
FIG. 3 provides a cross-sectional view of forming a second contact opening according to embodiments of the disclosure.

FIG. 3 depicts continued processing, in which mask 152 (FIG. 2) is removed (e.g., by stripping or other mask removal techniques) and replaced with another mask 156 to cover first opening 150 while exposing another portion of additional ILD layer 146. Mask 156 may be layer(s) of material that traverses and covers first opening 150 (e.g., by being supported by additional ILD layer 146), but mask 156 may fill first opening 150 in other implementations. Using mask 156, a second opening 158 may be formed through layers 140, 142, 144, 146 to expose raised E/C layer 122 thereunder. Second opening 158 may not extend through layers 120, 122 and thus may not expose doped semiconductor well 104 in the case where thermal coupling thereto is not needed. Second opening 158 thus may not be as deep as first opening 150. In alternative implementations, the depth and shape of second opening 158 may be similar to first opening 150, and thus second opening 158 optionally may be formed at the same time as first opening 150 using a single mask. After second opening 158, a second silicide layer 160 may be formed on raised E/C layer 122, e.g., by the same processes discussed herein to form first silicide layer 154 in first opening 150. In further embodiments, second silicide layer 160 may be formed within preliminary structure 100 (FIG. 1) before second opening 158 is created.

Figure 4:
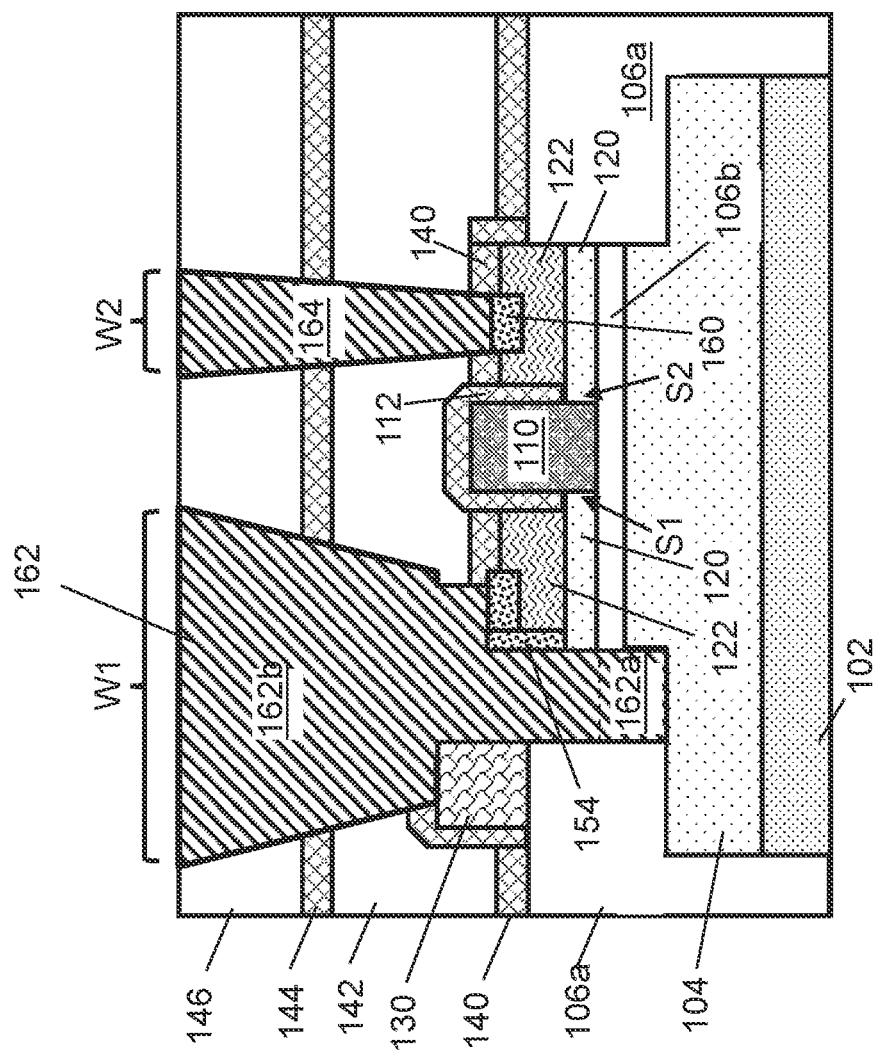
FIG. 4 provides a cross-sectional view of forming emitter/collector (E/C) contacts in the contact openings according to embodiments of the disclosure.

FIG. 4 depicts the filling of openings 150 (FIGS. 2, 3), 158 (FIG. 3) with conductive material. Mask 156 (FIG. 3) may be removed by stripping and/or other mask removal techniques, thereby allowing conductive material to be deposited within each opening 150, 158. A first E/C contact 162 may be formed within first opening 150, e.g., by conformally depositing a layer of refractory metal lining material on exposed surfaces of first opening 150 and filling the remaining portions of first opening 150 with a conductor such as tungsten (W), copper (Cu), cobalt (Co), aluminum (Al), etc., as well as non-metallic conductive materials (e.g., polycrystalline Si). The refractory metal liner materials of first E/C contact 162 may prevent electromigration degradation, shorting to other components, etc. Due to the shape of first opening 150, first E/C contact 162 may include a lower portion 162a that connects to doped semiconductor well 104 (e.g., by being on an upper surface or adjacent a sidewall thereof) and is adjacent insulative region 106. An upper portion 162b of first E/C contact 162 may be on lower portion 162a and coupled to raised E/C layer 122, e.g., through first silicide layer 154. Additionally, upper portion 162b of first E/C contact 162 may be on and adjacent portions of gate structure 130 in the case where gate structure 130 is electrically inactive. The coupling of first E/C contact 162 to gate structure 130 also may provide additional heat dissipation from electrically active components to gate structure 130. As part of the same deposition or in a subsequent operation, a second (alternatively, "additional") E/C contact 164 may be formed within second opening 158 for electrical coupling to second silicide layer 160. Due to the differences in size of openings 150, 158, first E/C contact 162 may have a largest width W1 that is larger than a largest width W2 of second E/C contact 164. The larger width W1 of first E/C contact 162 may result in, e.g., the larger size of opening 150 (FIGS. 2, 3) as compared to second opening 152 (FIG. 3) for placement on doped semiconductor well 104.

Figure 5:
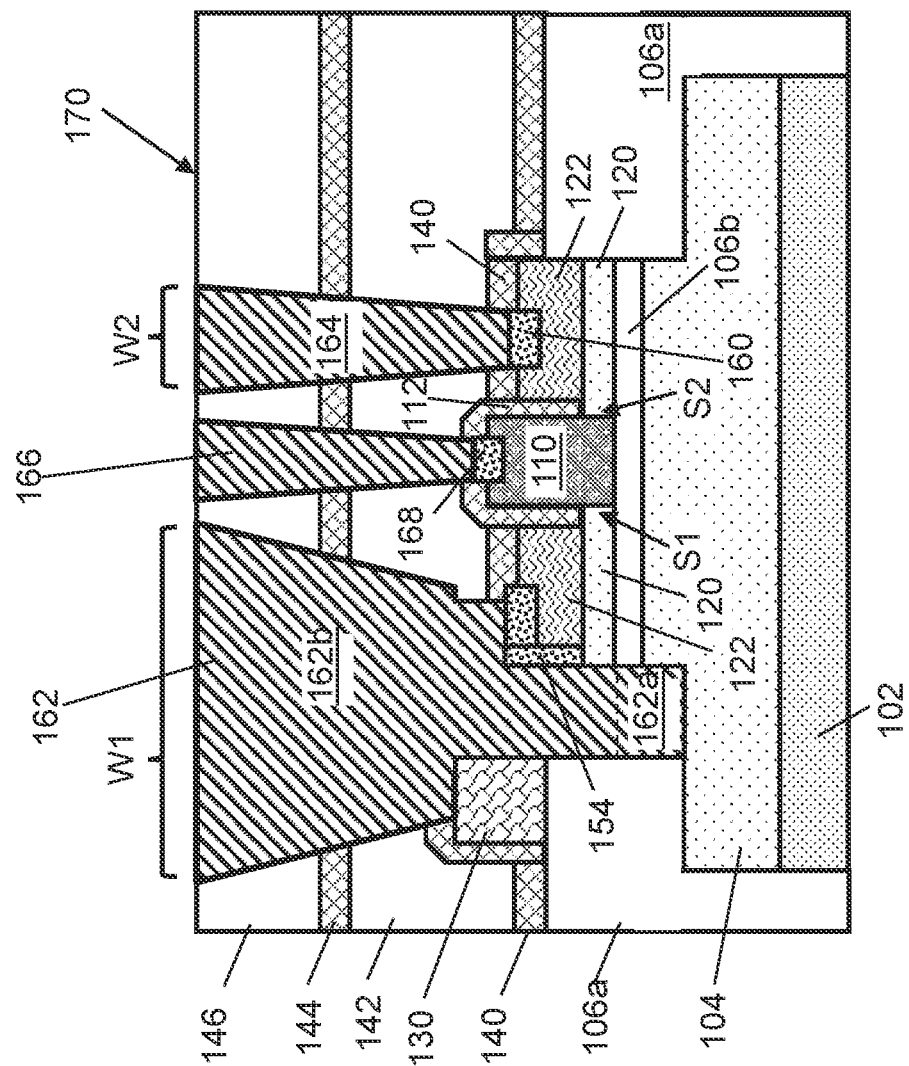
FIG. 5 provides a cross-sectional view of forming a base contact to form a bipolar transistor structure according to embodiments of the disclosure.

FIG. 5 depicts further processes to form a base contact 166 and third silicide layer 168 as remaining components of a bipolar transistor structure 170 according to embodiments of the disclosure. Base contact 166 may be formed in substantially the same manner as E/C contacts 162, 164, e.g., by forming a mask over additional ILD layer 146 and contacts 162, 164, and removing portions of layers 140, 142, 144, 146 over base layer 110. Third silicide layer 168 can then be formed on base layer in substantially the same manner as silicide layers 154, 160 or any other currently known or later developed technique to form silicide on a semiconductor material. Conductive material(s) and refractory metal liners then can be formed over third silicide layer 168 to create base contact 166. Thus, contacts 162, 164, 166 define conductive pathways to layers 110, 120, 122. First E/C contact 162, in addition, may include lower portion 162a that is in thermal communication with (e.g., by being on or adjacent) doped semiconductor well 104. Although doped semiconductor well 104 may not include electrically active elements and/or couplings thereto, the coupling from first E/C contact 162 to doped semiconductor well 104 may transfer heat from bipolar transistor structure 170 to doped semiconductor well 104 and substrate 102. First E/C contact 162 of bipolar transistor structure 170 thus may dissipate heat to substrate 102 during operation of bipolar transistor structure 170.

Figure 6:
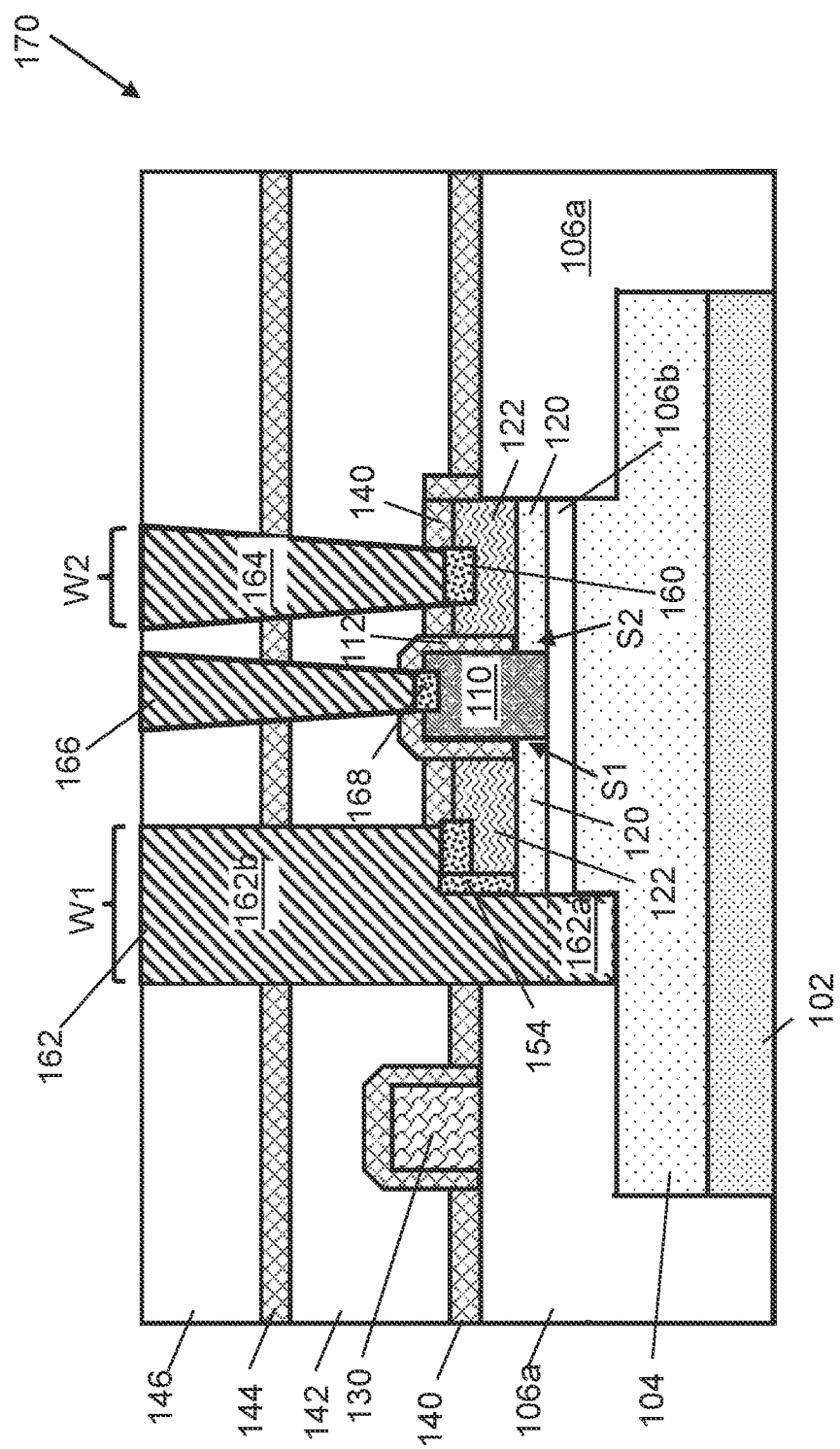
FIG. 6 provides a cross-sectional view of a bipolar transistor structure according to further embodiments of the disclosure.

FIG. 6 depicts an alternative implementation of bipolar transistor structure 170, e.g., in which first E/C contact 162 is not formed on any portion of gate structure 130. Here, gate structure 130 may be located at a greater horizontal distance away from E/C layer(s) 120 than in other implementations, and thus gate structure 130 may not be practical to use as a marking structure. In this case, first E/C contact 162 may nevertheless be formed using a differently shaped mask and/or other techniques to locate a suitable coupling to doped semiconductor well 104. In other respects, however, bipolar transistor structure 170 may be substantially identical to other implementations despite the lack of coupling to gate structure 130. In addition, first E/C contact 162 may have largest width W1 that is larger than largest width W2 of second E/C contact 162, e.g., due to the coupling of first E/C contact 162 to doped semiconductor well 104.

Figure 7:
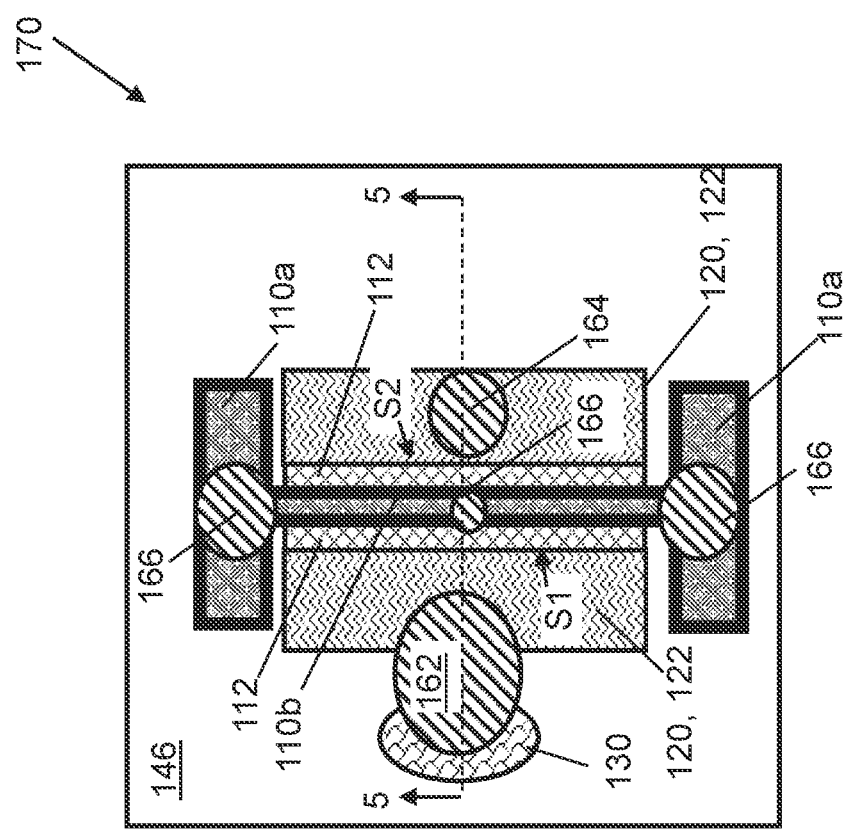
FIG. 7 provides a plan view of a bipolar transistor structure according to embodiments of the disclosure.

Turning to FIGS. 5 and 7, in which FIG. 5 depicts a cross-section along line 5-5 of the plan view in FIG. 7, further illustrative structural details of bipolar transistor structure 170 are discussed. As shown in FIG. 7, base layer 110 may be subdivided into an extrinsic base region 110a and an intrinsic base region 110b that is adjacent extrinsic base region 110a. Intrinsic base region 110b may be less highly doped than extrinsic base region 110a, e.g., to allow a stronger P-N junction to form between base layer 110 and E/C layer(s) 120, while allowing stronger electrical coupling to base layer 110 through extrinsic base region 110b. In addition, intrinsic base region 110b may be horizontally between two E/C layers 120, each of which may be adjacent a respective sidewall S1, S2 of base layer 110. In this configuration, base contacts 166 may be on extrinsic base region 110a, and additionally or alternatively may be on portions of intrinsic base region 110b. As discussed elsewhere herein, portions of first E/C contact 162 may be on E/C layer(s) 120, 122 and gate structure 130, while second E/C contact 164 may overlie only E/C layer(s) 120, 122.

Embodiments of the disclosure provide various technical and commercial advantages, some of which are discussed herein as examples. Bipolar transistor structures 170 according to embodiments of the disclosure may provide stronger heat dissipation, and thus lower operating temperatures, than bipolar transistor structures which lack heat dissipation to doped semiconductor well 104 and/or substrate 102 through first E/C contact 162. Lower operating temperatures, in turn may provide a more robust range of operating frequencies (including maximum and threshold current frequencies) as compared to conventional bipolar transistors. The reduction in operating temperature via bipolar transistor structure 170 with first E/C contact 162 to doped semiconductor well 104 also produces reduced current leakage as compared to conventional bipolar transistors.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A bipolar transistor structure comprising:
   a doped semiconductor well over a semiconductor substrate;
   an insulative region on the doped semiconductor well;
   a base layer on the insulative region;
   an emitter/collector (E/C) layer on the insulative region and adjacent a first sidewall of the base layer; and
   an E/C contact to the doped semiconductor well, the E/C contact including:
      a lower portion on the doped semiconductor well and including a first sidewall adjacent the insulative region and a second sidewall adjacent the doped semiconductor well, and
      an upper portion adjacent and electrically coupled to a horizontal end of the E/C layer, wherein a portion of the E/C contact is on an upper surface of the E/C layer.

2. The bipolar transistor structure of claim 1, further comprising:
   an additional E/C layer on the insulative region and adjacent a second sidewall of the base layer opposite the first sidewall; and
   an additional E/C contact to the additional E/C layer, wherein the additional E/C contact is above the insulative region and does not include an interface with the doped semiconductor well.

3. The bipolar transistor structure of claim 1, further comprising a gate structure on the insulative region and horizontally distal to the E/C layer, wherein a portion of the E/C contact is on an upper surface of the gate structure.

4. The bipolar transistor structure of claim 1, wherein the E/C layer and the doped semiconductor well have a same doping type.

5. The bipolar transistor structure of claim 1, further comprising a spacer on the E/C layer and adjacent a sidewall of the base layer, wherein the spacer is horizontally between the E/C contact and the base layer.

6. The bipolar transistor structure of claim 5, wherein the E/C layer includes:
   a first E/C material on the insulative region and adjacent the first sidewall of the base layer; and
   a second E/C material on the first E/C material, the second E/C material including a first sidewall adjacent the spacer and a horizontal end adjacent the E/C contact and partially covered by the upper portion of the E/C contact.

7. The bipolar transistor structure of claim 6, wherein the E/C layer further includes an E/C silicide on the second E/C material and adjacent the horizontal end of the second E/C material, the E/C silicide including a first sidewall adjacent the spacer and a second sidewall adjacent the E/C contact, wherein the E/C silicide is vertically between the second E/C material and the upper portion of the E/C contact.

8. A bipolar transistor structure comprising:
   a doped semiconductor well over a semiconductor substrate;
   an insulative region on the doped semiconductor well;
   a base layer on the insulative region;
   a first emitter/collector (E/C) layer on the insulative region and adjacent a first sidewall of the base layer;
   a first E/C contact to the doped semiconductor well, the first E/C contact including:
      a lower portion on the doped semiconductor well and including a first sidewall adjacent the insulative region and a second sidewall adjacent the doped semiconductor well, and
      an upper portion adjacent and electrically coupled to a horizontal end of the first E/C layer, wherein a portion of the E/C contact is on an upper surface of the first E/C layer;
   a second E/C layer on the insulative region and adjacent a second sidewall of the base layer opposite the first sidewall; and
   a second E/C contact to the second E/C layer, wherein a lower surface of the second E/C contact is on an upper surface of the second E/C layer, and above the insulative region.

9. The bipolar transistor structure of claim 8, further comprising a gate structure on the insulative region and horizontally distal to the first E/C layer, wherein a portion of the first E/C contact is on an upper surface of the gate structure.

10. The bipolar transistor structure of claim 8, wherein the first E/C layer, the second E/C layer, and the doped semiconductor well have a same doping type.

11. The bipolar transistor structure of claim 8, further comprising a spacer on the first E/C layer and the second E/C layer, wherein the spacer is horizontally between the first E/C contact and the base layer.

12. The bipolar transistor structure of claim 11, wherein the first E/C layer includes
   a first E/C material on the insulative region and adjacent the first sidewall of the base layer; and
   a second E/C material on the first E/C material, the second E/C material including a first sidewall adjacent the spacer and a horizontal end adjacent the E/C contact and partially covered by the upper portion of the E/C contact.

13. The bipolar transistor structure of claim 12, wherein the first E/C layer further includes an E/C silicide on the second E/C material and adjacent the horizontal end of the second E/C material, the E/C silicide including a first sidewall adjacent the spacer and a second sidewall adjacent the E/C contact, wherein the E/C silicide is vertically between the second E/C material and the upper portion of the E/C contact.

14. The bipolar transistor structure of claim 8, wherein a horizontal width of the first E/C contact is greater than a horizontal width of the second E/C contact.

15. A method of bipolar transistor structure comprising:
   forming a doped semiconductor well over a semiconductor substrate;
   forming a base layer on an insulative layer over the doped semiconductor well;
   forming an emitter/collector (E/C) layer on an insulative region and adjacent a first sidewall of the base layer; and
   forming an E/C contact to the doped semiconductor well, the E/C contact including:
      a lower portion on the doped semiconductor well and including a first sidewall adjacent the insulative region and a second sidewall adjacent the doped semiconductor well, and
      an upper portion adjacent and electrically coupled to a horizontal end of the E/C layer, wherein a portion of the E/C contact is on an upper surface of the E/C layer.

16. The method of claim 15, further comprising:
   forming an additional E/C layer on the insulative region and adjacent a second sidewall of the base layer opposite the first sidewall; and
   forming an additional E/C contact to the additional E/C layer, wherein the additional E/C contact is above the insulative region and does not include an interface with the doped semiconductor well.

17. The method of claim 15, further comprising forming a gate structure on the insulative region and horizontally distal to the E/C layer, wherein forming the E/C contact includes forming a portion of the E/C contact on an upper surface of the gate structure.

18. The method of claim 15, further comprising forming a spacer on the E/C layer and adjacent a sidewall of the base layer, wherein the spacer is horizontally between the E/C contact and the base layer.

19. The method of claim 18, wherein forming the E/C layer includes:
   forming a first E/C material on the insulative region and adjacent the first sidewall of the base layer; and
   forming a second E/C material on the first E/C material, the second E/C material including a first sidewall adjacent the spacer and a horizontal end adjacent the E/C contact and partially covered by the upper portion of the E/C contact.

20. The method of claim 19, wherein forming the E/C layer further includes forming an E/C silicide on the second E/C material, the E/C silicide including a first sidewall adjacent the spacer and a second sidewall adjacent the E/C contact, wherein a portion of the E/C contact is vertically between the second E/C material and the upper portion of the E/C contact.

* * * * *